(12) United States Patent
Yoshida

(10) Patent No.: US 7,969,028 B2
(45) Date of Patent: Jun. 28, 2011

(54) SEMICONDUCTOR DEVICE MOUNTING STRUCTURE, MANUFACTURING METHOD, AND REMOVAL METHOD OF SEMICONDUCTOR DEVICE

(75) Inventor: Hisahiko Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 284 days.

(21) Appl. No.: 12/102,359

(22) Filed: Apr. 14, 2008

(65) Prior Publication Data
US 2008/0308930 A1    Dec. 18, 2008

(30) Foreign Application Priority Data

Jun. 15, 2007   (JP) ................. 2007-158257

(51) Int. Cl.
*H01L 23/29* (2006.01)
(52) U.S. Cl. .............. 257/795; 257/E23.135
(58) Field of Classification Search .......... 257/787–795, 257/E23.135
See application file for complete search history.

(56) References Cited

U.S. PATENT DOCUMENTS

| | | | |
|---|---|---|---|
| 5,981,313 A * | 11/1999 | Tanaka ................. | 438/118 |
| 6,335,571 B1 | 1/2002 | Capote et al. | |
| 6,373,142 B1 | 4/2002 | Hoang | |
| 7,323,360 B2 * | 1/2008 | Gonzalez et al. ......... | 438/108 |
| 2008/0308930 A1 | 12/2008 | Yoshida | |

FOREIGN PATENT DOCUMENTS

| | | |
|---|---|---|
| JP | 2001-107019 | 4/2001 |
| JP | 2005-332970 | 12/2005 |
| JP | 2006-100457 | 4/2006 |

OTHER PUBLICATIONS

United States Office Action issued in U.S. Appl. No. 12/106,459 dated Mar. 9, 2010.
U.S. Office Action issued in U.S. Appl. No. 12/106,459, mailed on Jul. 29, 2010.
U.S. Office Action issued in U.S. Appl. No. 12/106,459, mailed on Mar. 9, 2010.
Related U.S. Appl. No. 12/106,459 to Yokota, filed Apr. 21, 2008, entitled "Electronic Device and Manufacturing Method".

* cited by examiner

*Primary Examiner* — Jenny L. Wagner
(74) *Attorney, Agent, or Firm* — McDermott Will & Emery LLP

(57) ABSTRACT

A semiconductor device mounting structure includes a semiconductor device whose electrodes are aligned on its one main face; a circuit board having board electrodes electrically connected to the electrodes of the semiconductor device by solder bumps; and curable resin applied between at least the side face of the semiconductor device and the circuit board. Multiple types of thermally expandable particles with different expansion temperatures are mixed in this curable resin. This structure offers the semiconductor device mounting structure that is highly resistant to impact and suited for mass production, its manufacturing method, and a removal method of the semiconductor device. In addition, this structure facilitates repair and reworking, leaving almost no adhesive residue on the circuit board after repair. Stress applied to the circuit board during repair can also be minimized.

7 Claims, 9 Drawing Sheets

SEMICONDUCTOR DEVICE MOUNTING STRUCTURE, MANUFACTURING METHOD, AND REMOVAL METHOD OF SEMICONDUCTOR DEVICE

BACKGROUND OF THE INVENTION

1. Field of the Invention

The present invention relates to semiconductor device mounting structures that are resistant to impact and also show ease of repair, their manufacturing methods, and removal methods of the semiconductor device.

2. Background Art

Electronic devices are becoming ever smaller and more sophisticated, and the use of small portable mobile information devices, including mobile phones and personal computers, is increasingly widespread. Electronic components mounted on circuit boards in these devices contain numerous semiconductor devices. Semiconductor devices are normally mounted in the form of a package, in which a semiconductor chip is mounted on an interposer and molded with resin. More specifically, ball grid arrays (hereinafter abbreviated to "BGAs") and chip scale packages ("CSPs") are the commonest types of package used for semiconductor devices. BGAs have a structure in which connecting terminals, typically formed of ball-shaped solder bumps, are aligned in an array on one main face of the semiconductor device facing a circuit board.

Since mobile information devices are portable, they require strong resistance to impact if dropped. A semiconductor device, in which functional circuits including logic circuits and memory circuits are densely packed, has a vast number of connecting terminals. As a result, BGA and CSP packages have very small terminals and fine terminal pitch. In addition, semiconductor devices formed of packages such as BGAs and CSPs have connecting terminals aligned on a grid, giving a large mounting area. Stress may thus be concentrated on the connecting terminals disposed near the edge of the semiconductor device package due to deformation of the circuit board or stress caused by dropping. As a result, soldering between the semiconductor device and circuit board may be damaged or broken.

This has prompted studies of a means of improving the reliability of connection between the semiconductor device and the circuit board against drop impact. One general approach is first to solder the semiconductor device and circuit board, and then reinforce the connection by fixing the semiconductor device to the circuit board using a thermosetting adhesive such as epoxy resin. This reduces concentration of stress, caused typically by drop impact, on the connecting terminals, thus improving impact resistance. However, if a characteristic failure is found in the semiconductor device after being mounted on the board, the semiconductor device needs to be replaced. In this case, the thermosetting adhesive on the circuit board needs to be removed to allow re-connection of a replacement semiconductor device to the circuit board. However, tight adhesion of thermosetting adhesive on the circuit board hinders its removal, making repair difficult. As a result, there is no choice but to dispose of the entire circuit board if a characteristic failure is found.

To solve this issue, Japanese Patent Unexamined Publication No. 2006-100457 proposes a mounting structure that has high impact resistance and also enables repair and reworking. More specifically, it proposes a semiconductor device mounting structure that employs resin consisting of two layers for bonding the semiconductor device to the circuit board. One layer uses resin that can be removed, and the other layer uses resin with high mechanical strength. The semiconductor can thus be removed from the circuit board by heating the removable resin layer until it becomes fluid, to allow removal when repair is needed, such as when replacing the semiconductor device.

Japanese Patent Unexamined Publication No. 2005-332970 proposes a semiconductor device mounting structure in which resin composite is injected between the semiconductor device and the circuit board and then cured. This resin composite is made of organic thermally expandable particles encapsulating an organic solution and thermosetting adhesive resin. In this semiconductor device mounting structure, which has strong impact resistance as configured above, the organic solution in the organic thermally expandable particles boils and evaporates by heating, causing rapid volume expansion. This changes the resin hardener that bonds the semiconductor device to the circuit board into an extremely brittle and porous structure. The semiconductor device thus becomes removable, allowing the semiconductor device mounting structure to be repaired.

Japanese Patent Unexamined Publication No. 2001-107019 also proposes the inclusion of a foamable material in the adhesive used to firmly bond the semiconductor device to the circuit board so that the semiconductor device can be removed from the circuit board by making the foamable material foam significantly at the time of repair. In other words, when adhesive including paste and foamable material is heated or microwaved, the foamable material is foamed. This generates numerous pores in the paste, and makes the paste brittle, facilitating removal of the semiconductor device from the circuit board.

However, the prior arts disclosed in the above Japanese Patent Unexamined Publication Nos. 2005-332970 and 2001-107019 require the heating temperature to be very precisely controlled to be able to effectively expand the thermally expandable particles or foamable material to permit removal of the semiconductor device from the circuit board. A temperature range that generates effective expansion force in the thermally expandable particles or foamable material is typically 10 to 20° C. This temperature range is not sufficient for application to mass-production processes.

In other words, if the temperature needed to attain maximum expansion force is below the melting point of the solder bumps, the thermally expandable particles or foamable material cannot gain sufficient expansion force. As a result, not all the thermosetting adhesive can be made sufficiently brittle, preventing easy removal of the semiconductor device from the circuit board. If the amount of thermally expandable particles or foamable material contained in adhesive is increased so as to increase the expansion force, the semiconductor device will be lifted from the circuit board with the solder bumps unmelted. This may cause tearing damage due to stress applied to the copper foil on the circuit board. As a result, re-connection of a new semiconductor device onto an electrode of the circuit board becomes impossible, necessitating disposal of the circuit board.

On the other hand, if the temperature for attaining the maximum expansion force is the same or higher than the melting point of the solder bumps, the circuit board will not be damaged during removal of the semiconductor device, since the solder bumps are sufficiently molten, even if the thermally expandable particles or foamable material expands sufficiently at this temperature. However, the thermally expandable particles or foamable material included in the adhesive need to provide sufficient expansion force to facilitate removal of the semiconductor device by making all of the adhesive fully brittle. For this purpose, the solder bumps need to be retained at a temperature higher than their melting point for a long period of time. As a result, the components mounted around the semiconductor device on the circuit board may become thermally damaged.

In the prior art disclosed in Japanese Patent Unexamined Publication No. 2006-100457, it is difficult to remove the semiconductor device from the circuit board in the semiconductor device mounting structure without leaving any residue on the circuit board, and then to re-connect a new semiconductor device in that state after removal.

SUMMARY OF THE INVENTION

The semiconductor device mounting structure of the present invention includes a semiconductor device in the form of a small package that is suited for high-density mounting. This semiconductor device mounting structure demonstrates high impact resistance and is suited for mass production. In addition, repair and rework are easy, normally no adhesive residue remains on the circuit board after repair, and stress is minimized during the repair process. The present invention also offers a method of manufacturing this semiconductor device mounting structure, and a method of removing semiconductor devices.

The semiconductor device mounting structure of the present invention includes a semiconductor device whose electrodes are aligned on its one main face, a circuit board having board electrodes to which the electrodes of the semiconductor device are electrically connected by solder bumps, and curable resin applied between at least a side face of the semiconductor device and the circuit board. This curable resin includes multiple types of thermally expandable particles with different expansion temperatures.

This structure achieves high impact resistance when the semiconductor device is mounted on the circuit board, and enables easy removal of the semiconductor device from the circuit board during repair and reworking. In the process of repair or reworking, thermally expandable particles whose expansion temperature is low expand first, making all of the adhesive brittle; and then thermally expandable particles whose expansion temperature is high expand to immediately break adhesion of the semiconductor device to the circuit board by curable resin. If the melting point of the solder bumps is set to between the expansion temperatures of the above two types of thermally expandable particles, the semiconductor device can be easily removed from the circuit board in the semiconductor device mounting structure. In addition, since curable resin is provided only between the side face of the semiconductor device and the circuit board, this structure is suited for mass production. Still more, since all of the curable resin is fragmented by multiple types of thermally expandable particles, there is almost no curable resin residue containing thermally expandable particles remaining on the circuit board after repair. Stress applied during repair can also be minimized.

A method of manufacturing the semiconductor device mounting structure of the present invention includes the steps of soldering electrodes aligned on one main face of the semiconductor device and board electrodes of the circuit board by solder bumps for electrical connection; applying curable adhesive, in which multiple types of thermally expandable particles with different expansion temperatures are mixed, between at least the side face of the semiconductor device and the circuit board; and fixing by resinifying the adhesive applied in the application step into curable resin.

A method of removing the semiconductor device of the present invention includes the steps of heating the curable resin firstly at a temperature lower than the melting point of the solder bumps so as to expand the thermally expandable particles with an expansion temperature lower than the melting point in multiple types of thermally expandable particles; heating curable resin secondly at a temperature not less than the melting point so as to expand thermally expandable particles with an expansion temperature higher than the melting point in the multiple types of thermally expandable particles; and removing of the semiconductor device from the circuit board.

This method enables easy removal of the semiconductor device from the circuit board for repair or reworking. In addition, since all of the curable resin is fragmented by the multiple types of thermally expandable particles, almost no curable resin residue remains on the circuit board after repair. Stress applied during repair can also be minimized.

DETAILED DESCRIPTION OF THE INVENTION

Exemplary embodiments of the present invention are described below with referent to drawings.

First Exemplary Embodiment

Figure 1A:
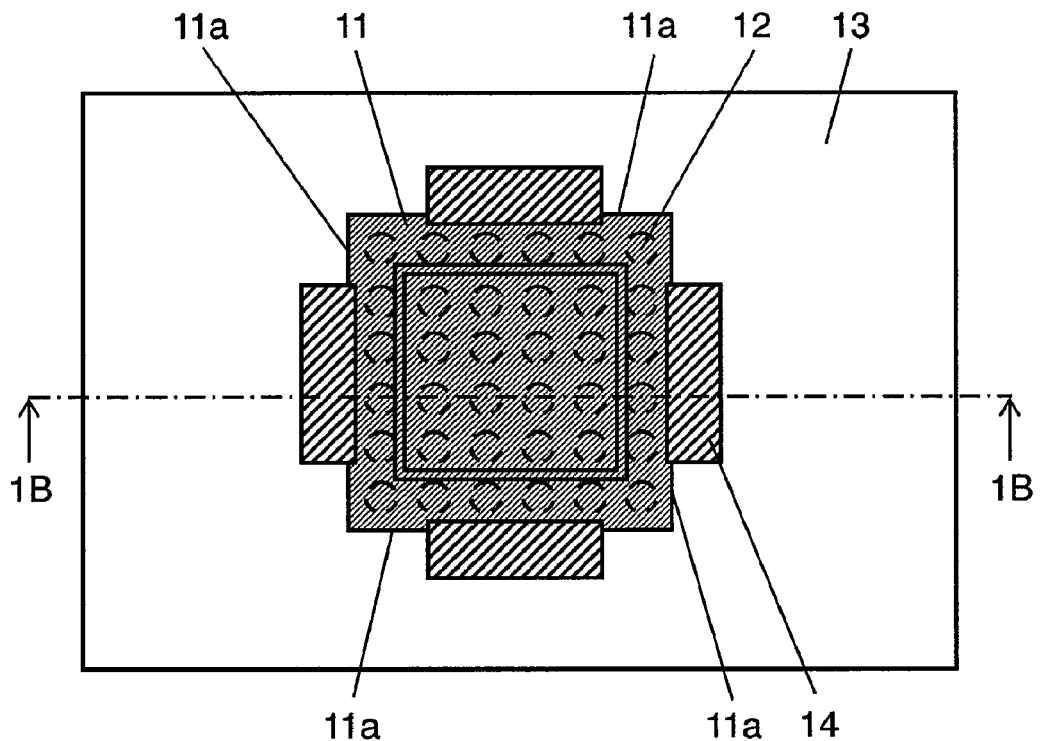
FIG. 1A is a schematic plan view of a semiconductor device mounting structure in accordance with a first exemplary embodiment of the present invention. It shows the case that a part of a side face of the semiconductor device is bonded and fixed by curable resin.
Figure 1B:
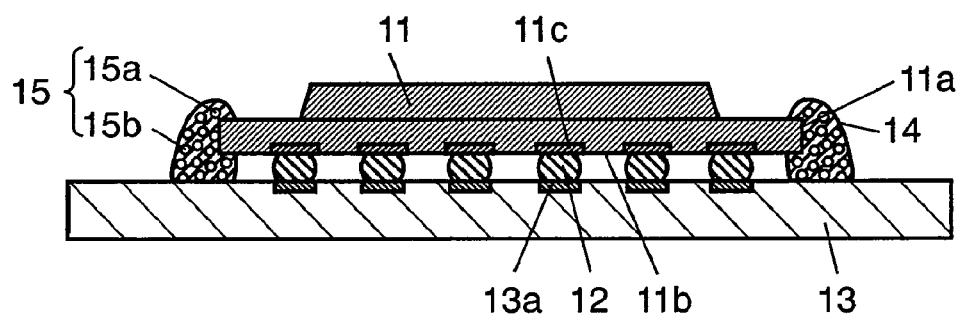
FIG. 1B is a sectional view taken along line 1B-1B in FIG. 1A.

FIG. 1A is a schematic plan view of semiconductor device mounting structure 10 in the first exemplary embodiment of the present invention, and FIG. 1B is a sectional view taken along line 1B-1B in FIG. 1A.

As shown in FIG. 1A, semiconductor device 11 is electrically and mechanically connected to circuit board 13 by solder bump 12 in semiconductor device mounting structure 10. To reinforce mechanical connection strength, a part of each of four side faces 11a of semiconductor device 11 is bonded and fixed to circuit board 13 by curable resin 14 that is thermally cured adhesive (hereafter also referred to as "thermosetting adhesive" or simply "adhesive").

More specifically, as detailed in FIG. 1B, semiconductor device mounting structure 10 has semiconductor device 11 whose electrodes 11c are aligned on its one main face 11b, and circuit board 13 whose board electrodes 13a are electrically connected to electrodes 11c of semiconductor device 11 by solder bumps 12. Semiconductor device mounting structure 10 also is applied curable resin 14 between at least side face 11a of semiconductor device 11 and circuit board 13. Multiple types of thermally expandable particles 15 with different expansion temperatures are mixed in this curable resin 14.

Figure 1C:
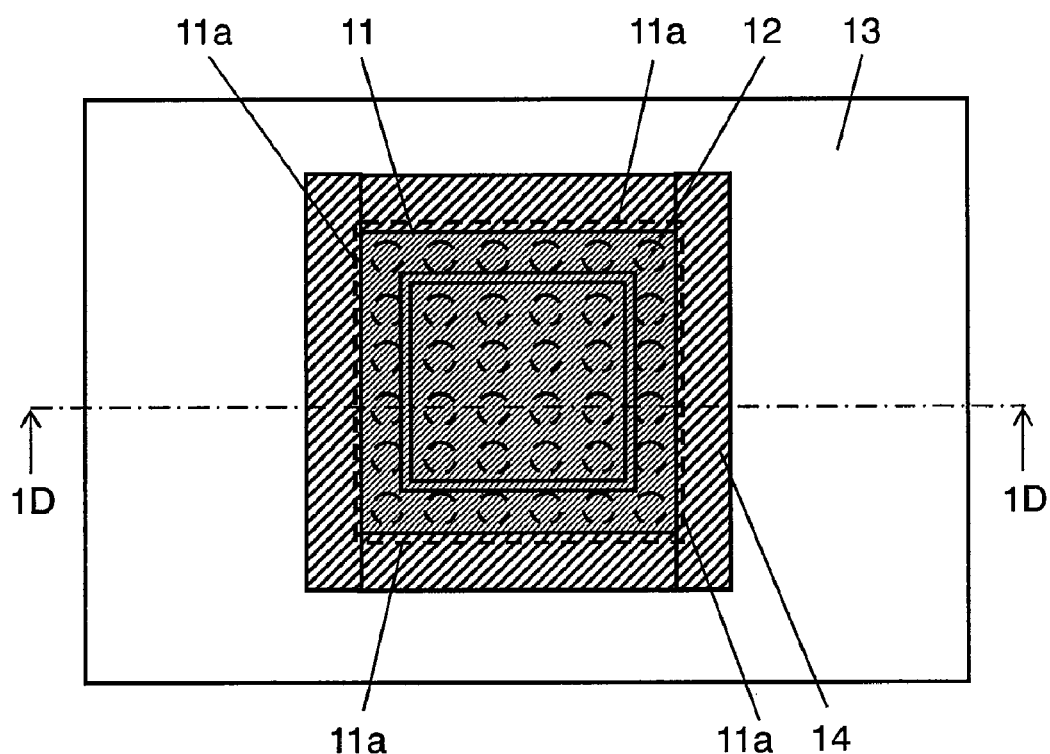
FIG. 1C is a schematic plan view of another example of the semiconductor device mounting structure in accordance with the first exemplary embodiment of the present invention. It shows the case that the entire periphery of the side face of the semiconductor device is bonded and fixed by the curable resin.
Figure 1D:
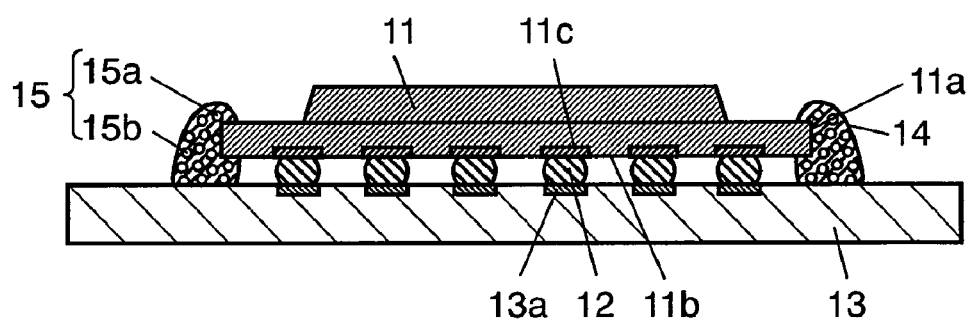
FIG. 1D is a sectional view taken along line 1D-1D in FIG. 1C.

In FIG. 1B, a part of side face 11a is bonded and fixed by curable resin 14. However, entire side face 11a may be bonded and fixed. As shown in FIGS. 1C and 1D, curable resin 14 may bond and fix the entire periphery of at least side face 11a of semiconductor device 11. FIG. 1C is a schematic plan view of another example of the semiconductor device mounting structure in the first exemplary embodiment of the present invention. FIG. 1D is a sectional view taken along line 1D-1D in FIG. 1C. In other words, as shown in FIGS. 1C and 1D, curable resin 14, in which multiple types of thermally expandable particles 15 with different expansion temperatures are mixed, may be applied between at least the entire periphery of side face 11a of semiconductor device 11 and circuit board 13 in semiconductor device mounting structure 10. This structure enables adhesion and fixing of the entire periphery of side face 11a of semiconductor device 11 to circuit board 13, therefore mechanical connection can be reinforced with further higher mechanical strength.

Figure 1E:
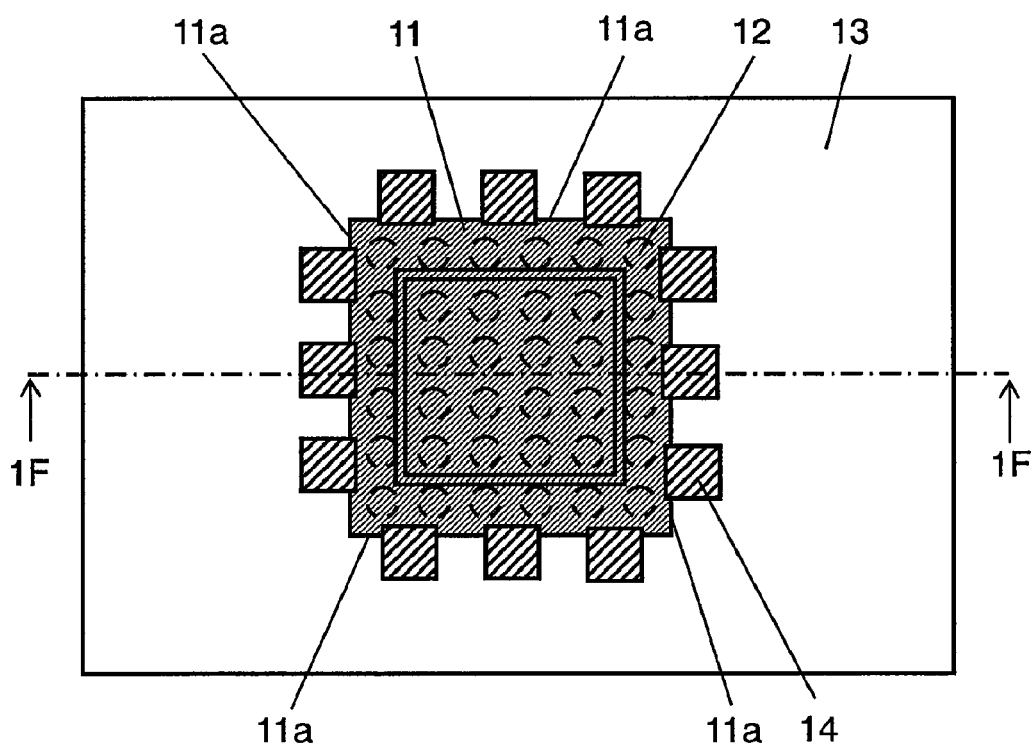
FIG. 1E is a schematic plan view of still another example of the semiconductor device mounting structure in accordance with the first exemplary embodiment of the present invention. It shows the case that multiple discontinuing points on the entire periphery of the side face of the semiconductor device are bonded and fixed by the curable resin.
Figure 1F:
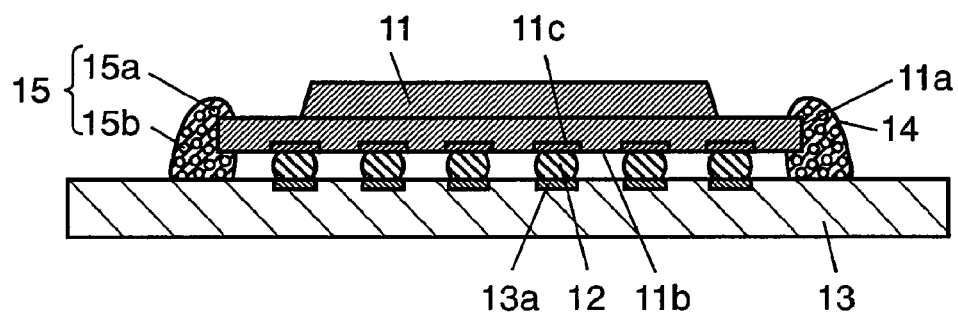
FIG. 1F is a sectional view taken along line 1F-1F in FIG. 1E.

Furthermore, as shown in FIGS. 1E and 1F, curable resin 14 may also be provided to bond and fix semiconductor device 11 only at multiple discontinuing points on at least the entire periphery of side face 11a of semiconductor device 11. FIG. 1E is a schematic plan view of still another example of the semiconductor device mounting structure in the first exemplary embodiment of the present invention. FIG. 1F is a sectional view taken along line 1F-1F in FIG. 1E. In other words, as shown FIGS. 1E and 1F, curable resin 14, in which multiple types of thermally expandable particles 15 with different expansion temperatures are mixed, may be provided between semiconductor device 11 and circuit board 13 only at multiple discontinuing points on the entire periphery of at least side face 11a of semiconductor device 11. Curable resin 14 is applied to multiple intermittent points between the entire periphery of at least side face 11a of semiconductor device 11 and circuit board 13, instead of bonding and fixing semiconductor device 11 and circuit board 13 by applying curable resin 14 to the entire periphery of at least side face 11a of semiconductor device 11 and circuit board 13. In this exemplary embodiment, as shown in FIG. 1E, curable resin 14 is applied to three points in each side face 11 of semiconductor device 11 as an example. With this structure, stress applied to a bonded and fixed part of semiconductor device 11 and circuit board 13 can be dispersed in semiconductor device mounting structure 10 even if circuit board 13 greatly deforms. FIG. 1E gives an example of applying curable resin 14 to three points. However, it is apparent that the number of application points are not limited in the present invention. Mechanical strength can be reinforced by this more flexible structure, compared to that shown in FIGS. 1A and 1C.

The multiple types of thermally expandable particles 15 include at least two types of particles: First thermally expandable particles 15a that expand by heat at first expansion temperature T1, and second thermally expandable particles 15b that expand by heat at second expansion temperature T2.

Melting point Tm of solder bump 12 is set to be higher than first expansion temperature T1 and lower than second expansion temperature T2.

This structure reinforces the mechanical strength by bonding side face 11a of semiconductor device 11 to circuit board 13 by curable resin 14, in addition to a structure that connects semiconductor device 11 and circuit board 13 by solder bump 12. Accordingly, semiconductor device 11 can be mounted while retaining a high impact resistance. In addition, when a repair or reworking is needed, first thermally expandable particles 15a whose expansion temperature is low expand, making all of curable resin 14 brittle, and then second thermally expandable particles 15b whose expansion temperature is high expand to immediately break adhesion of curable resin 14. Here, melting point Tm of solder bump 12 is set to between first expansion temperature T1 and second expansion temperature T2 of the above two types of thermally expandable particles 15 (first thermally expandable particles 15a and second thermally expandable particles 15b). Accordingly, semiconductor device 11 can be easily removed from circuit board 13 in semiconductor device mounting structure 10. Since thermosetting adhesive 14 that becomes curable resin 14 by heating is applied only to side face 11a of semiconductor device 11, without the need of filling between semiconductor device 11 and circuit board 13 as an underfill, this structure is suited for mass production. In addition, since all of adhesion by curable resin 14 is fragmented by the two types of thermally expandable particles 15 (first thermally expandable particles 15a and second thermally expandable particles 15b), almost no residue typically of curable resin 14 remains on circuit board 13 after repair. Stress applied to circuit board 13 during repair can also be minimized.

Curable resin mainly contains so-called thermosetting resin that cures by polymerization, such as three-dimensional cross-linking, of a low molecular compound containing polymer group such as epoxy group or acrylate group in its molecular structure triggered by an external stimulus such as light or heat. In the following description, curable resin is referred to as thermosetting resin as required, and thermosetting resin precursor, mainly containing the relevant low molecular compound, is referred to as thermosetting adhesive, as required.

In general, ball-shaped solder bumps 12 are made of Sn.3.0% Ag.0.5% Cu, a commonly used lead-free solder material, and are used for semiconductor device 11, including BGA and CSP semiconductor packages. The melting point of solder bumps 12 made of Sn.3.0% Ag.0.5% Cu is 217° C. Accordingly, when solder bumps 12 made of Sn.3.0% Ag.0.5% Cu are used, first thermally expandable particles 15a whose first expansion temperature T1 is not less than 120° C. and not more than 200° C., and second thermally expandable particles 15b whose second expansion temperature T2 is not less than 220° C. and not more than 240° C. are mixed in thermosetting adhesive 14. In this case, if the heating temperature is set to about 170° C., first thermally expandable particles 15a expand first. However, the heating temperature is not limited to 170° C. provided that the heating temperature is lower than 217° C. that is the melting point of solder bumps 12. As a result of this heating, all of curable resin 14 that is cured adhesive becomes brittle in advance. The heating temperature is then increased to 217° C. that is the melting point of solder bumps 12, to melt solder bumps 12.

The heating temperature is then further increased to 220° C. to expand second thermally expandable particles 15b. This immediately breaks the adhesion of all of curable resin 14. As a result, the adhesion of all of curable resin 14 is fragmented, and almost no residue typically of curable resin 14 remains on circuit board 13 after repair. Stress applied to circuit board 13 during repair can also be minimized. The heating temperature is not limited to 220° C. provided that the temperature is higher than 217° C. that is the melting point of solder bumps 12. However, a heating temperature of 250° C. or higher is not preferable because semiconductor device 11 may be damaged by heat. Accordingly, the use of thermally expandable particles 15 whose expansion temperature is 250° C. or higher is not preferable because semiconductor device may be damaged by heat. In contrast, if thermally expandable particles 15 whose expansion temperature is less than 120° C. are used, adhesive whose curing temperature is lower than 120° C. needs to be selected. This is also not preferable because it would limit the selection of adhesives.

Figure 2:
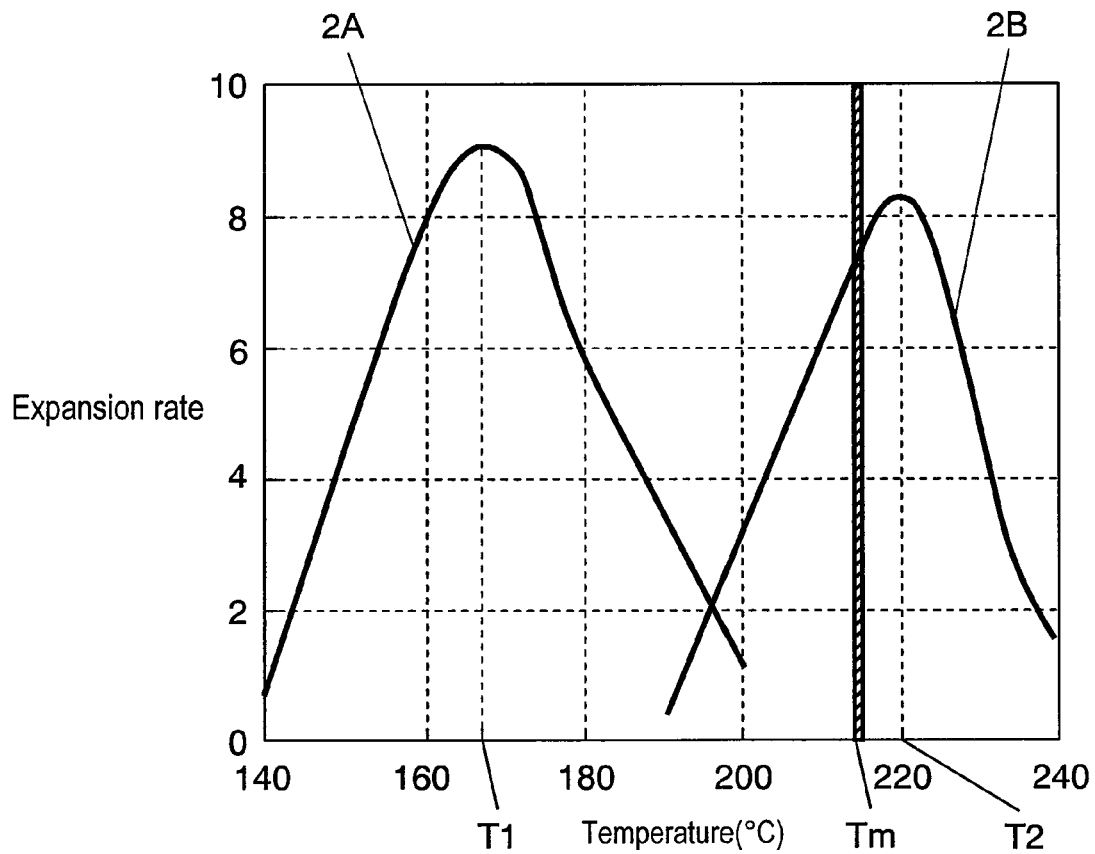
FIG. 2 illustrates an example of thermal expansion characteristic relative to temperature of two types of thermally expandable particles.

FIG. 2 is an example of the thermal expansion characteristic relative to temperature of two types of thermally expandable particles 15 (first thermally expandable particles 15a and second thermally expandable particles 15b) mixed in adhesive 14. In FIG. 2, a curve indicated 2A shows the thermal expansion characteristic of first thermally expandable particles 15a relative to temperature. These particles 15a demonstrate the highest expansion rate at first expansion temperature T1. A curve indicated 2B shows the thermal expansion characteristic of second thermally expandable particles 15b relative to temperature. Particles 15b demonstrate the highest expansion rate at second expansion temperature T2. FIG. 2 shows that the relationship of melting point Tm of solder bumps 12 with first expansion temperature T1 and second expansion temperature T2 is T1<Tm<T2. First thermally expandable particles 15a and second thermally expandable particles 15b in FIG. 2 are known to expand up to about 8-fold.

The next is described a method of manufacturing semiconductor device mounting structure 10 in this exemplary embodiment by mixing the two types of thermally expandable particles 15 (first thermally expandable particles 15a and second thermally expandable particles 15b) shown in FIG. 2 in adhesive 14.

Figure 3:
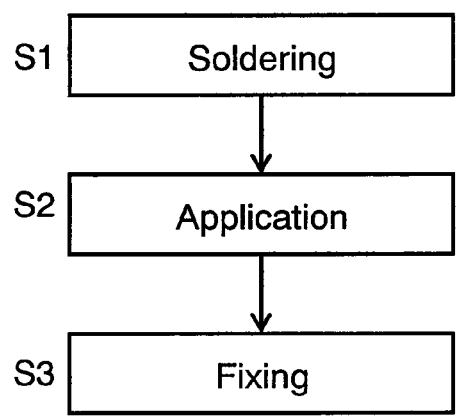
FIG. 3 is a process flow chart of a manufacturing method of the semiconductor device mounting structure in accordance with the first exemplary embodiment of the present invention.
Figure 4A:
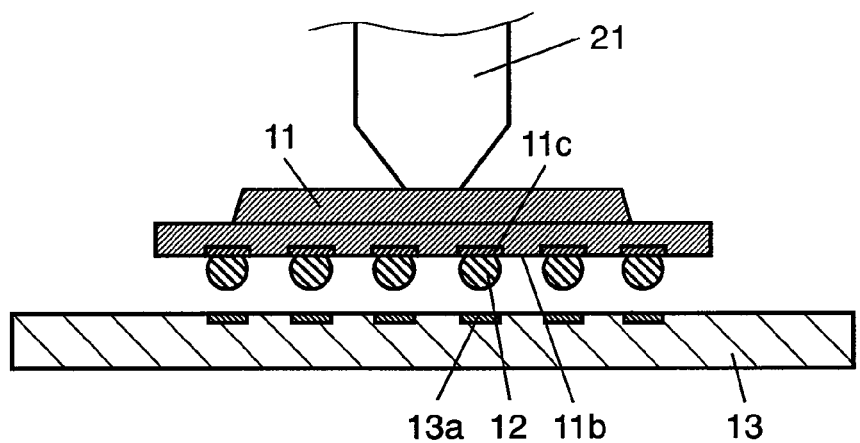
FIG. 4A is a schematic sectional view illustrating the manufacturing method of the semiconductor device mounting structure in accordance with the first exemplary embodiment of the present invention. It shows the state that the semiconductor device is held by a vacuum chuck, and carried to a circuit board for soldering.
Figure 4B:
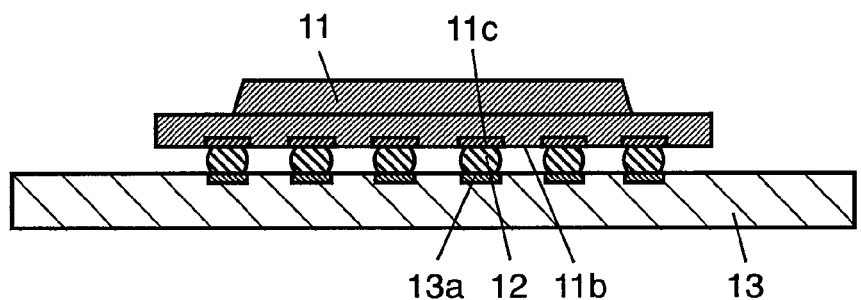
FIG. 4B is a schematic sectional view illustrating the manufacturing method of the semiconductor device mounting structure in accordance with the first exemplary embodiment of the present invention. It shows the state that a solder bump is electrically connecting an electrode of the semiconductor device to a board electrode of the circuit board.
Figure 4C:
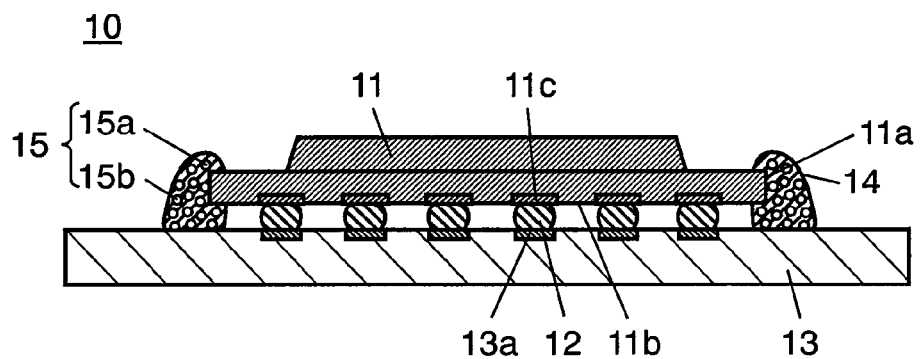
FIG. 4C is a schematic sectional view illustrating the manufacturing method of the semiconductor device mounting structure in accordance with the first exemplary embodiment of the present invention. It shows the state that curable adhesive is applied between the side face of the semiconductor device and the circuit board.

FIG. 3 is a process flow chart illustrating the manufacturing method of semiconductor device mounting structure 10 in this exemplary embodiment. FIGS. 4A to 4C are schematic sectional views illustrating the manufacturing method of semiconductor device mounting structure 10 in this exemplary embodiment.

As shown in FIG. 3, the manufacturing method includes soldering step S1, application step S2, and fixing step S3. FIG. 4A shows a process of carrying semiconductor device 11 to circuit board 13 by vacuum chuck 21 for soldering. As shown in FIGS. 4A and 4B, soldering step S1 is the step of electrically connecting electrodes 11C aligned on one main face 11b of semiconductor device 11 to board electrodes 13a on circuit board 13 by solder bumps 12. In FIG. 4B, solder bumps 12 are heated and melted typically at 230° C., and then cooled down to electrically connect electrodes 11C of semiconductor device 11 and board electrodes 13a of circuit board 13.

Next, as shown in FIG. 4C, thermosetting adhesive 14, in which multiple types of thermally expandable particles 15 with different expansion temperatures are mixed, is applied between side face 11a of semiconductor device 11 and circuit board 13 in application step S2. Then in fixing step S3 after application step S2, adhesive 14 applied in application step S2 is thermally cured to resinify adhesive 14 into curable resin. By bonding and fixing semiconductor device 11 and circuit board 13 using curable resin, semiconductor device mounting structure 10 increases its impact resistance against drop impacts, and so on. Adhesive 14 is typically epoxy resin thermally cured at 120° C.

The multiple types of thermally expandable particles 15 mixed in adhesive 14 are first thermally expandable particles 15 whose first expansion temperature T1 is lower than melting point Tm of solder bumps 12, and second thermally expandable particles 15b whose second expansion temperature T2 is not less than melting point Tm of solder bumps 12.

Figure 5A:
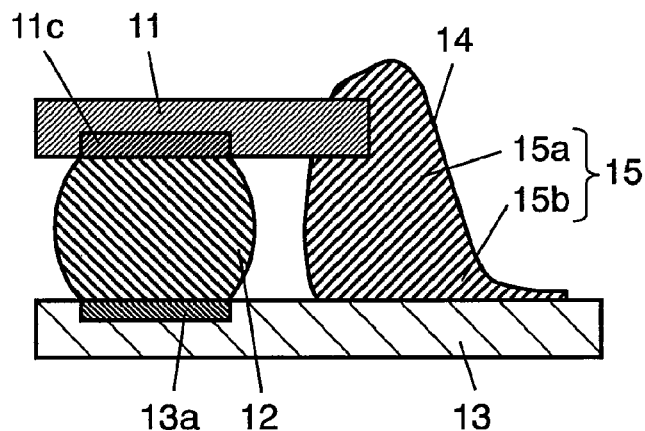
FIG. 5A is a schematic sectional view illustrating a removal method of the semiconductor device in accordance with the first exemplary embodiment of the present invention. It shows a magnified view of a portion in the semiconductor device mounting structure bonded by the curable resin.
Figure 5B:
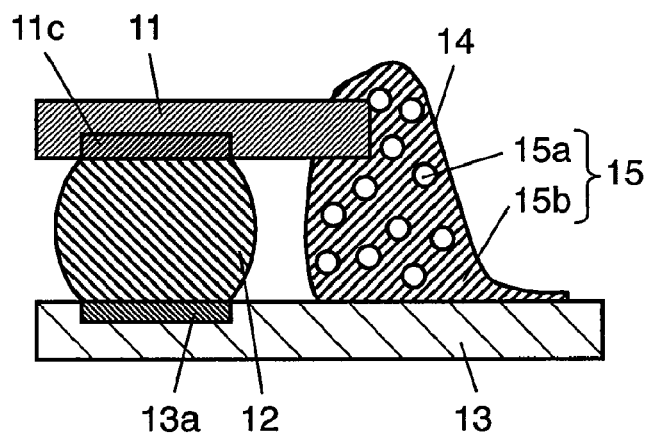
FIG. 5B is a schematic sectional view illustrating the removal method of the semiconductor device in accordance with the first exemplary embodiment of the present invention. It shows a schematic view of the state that the curable resin is fragmented internally by thermal expansion of first thermally expandable particles.
Figure 5C:
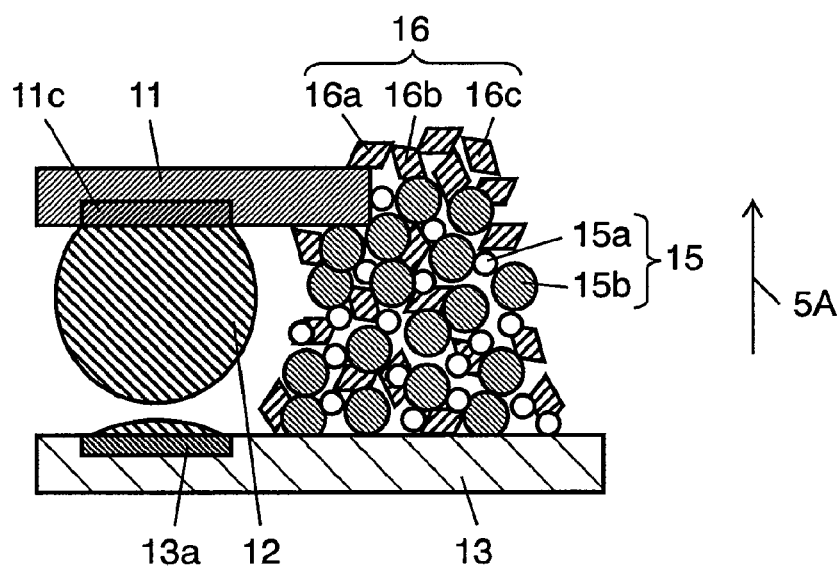
FIG. 5C is a schematic sectional view illustrating the removal method of the semiconductor device in accordance with the first exemplary embodiment of the present invention. It shows a schematic view of the state that the semiconductor device is lifted in a direction of arrow 5A from the circuit board, together with the solder bump, by thermal expansion of second thermally expandable particles, and thus adhesion of all of the curable resin is broken.

Next, a method of removing semiconductor device 11 from semiconductor device mounting structure 10 is described. FIGS. 5A, 5B, and 5C are schematic sectional views illustrating the removal method of semiconductor device 11 in this exemplary embodiment. FIG. 5A is a schematic view magnifying a portion bonded by curable resin 14 in semiconductor device mounting structure 10 shown in FIG. 4C. Curable resin 14 contains, for example, two types of thermally expandable particles 15 (first thermally expandable particles 15a and second thermally expandable particles 15b) shown in FIG. 2. In semiconductor device mounting structure 10 as described above, curable resin 14 is heated at 170° C. to expand first thermally expandable particles 15a at a rate close to the highest expansion rate shown by curve 2A in FIG. 2A. This enables first thermally expandable particles 15a to thermally expand and internally break curable resin 14, making resin 14 brittle, as shown in FIG. 5B. Then, curable resin 14 is further heated to 220° C. to expand second thermally expandable particles 15b. Since curable resin 14 has already been embrittled by thermal expansion of first thermally expandable particles 15a, thermal expansion of second thermally expandable particles 15b lifts semiconductor device 11 in the direction indicated by arrow 5A in FIG. 5C from circuit board 13, together with solder bumps 12. Accordingly, adhesion of all curable resin 14 is internally broken. Using the above method, curable resin 14 is broken into fine resin particles 16 (16a, 16b, and 16c). In other words, for example, curable resin 14 is broken into resin particles 16a, 16b, and 16c in a variety of directions, as shown in FIG. 5C, because all of curable resin 14 has already been embrittled. Accordingly, semiconductor device 11 connected by curable resin 14 can be easily removed from circuit board 13.

Figure 6:
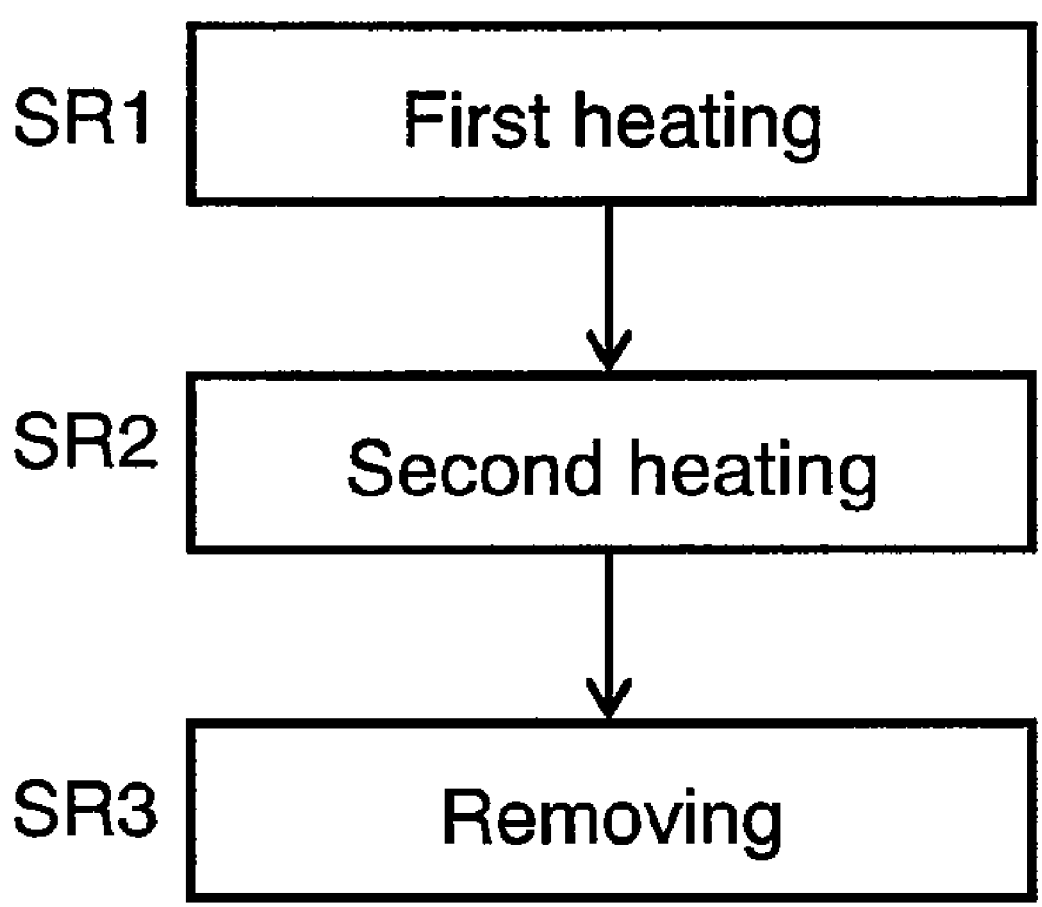
FIG. 6 is a flow chart illustrating the removal method of the semiconductor device from the semiconductor device mounting structure in accordance with the first exemplary embodiment of the present invention.

As described above, the removal method of the semiconductor device in this exemplary embodiment includes first heating step SR1, second heating step SR2, and removal step SR3 for semiconductor device mounting structure 10 shown in FIG. 6.

More specifically, first heating step SR1 is the step of heating curable resin 14 to a temperature not more than melting point Tm of solder bump 12 so as to expand thermally expandable particles with the expansion temperature lower than melting point Tm in the multiple types of thermally expandable particles 15. Then, second heating step SR2 is the step of heating curable resin 14 to melting point Tm or higher so as to expand thermally expandable particles with the expansion temperature higher than melting point Tm in the multiple types of thermally expandable particles 15. Removing step SR3 is the step of removing semiconductor device 11 from circuit board 13.

The removal method including these steps facilitates removal of the semiconductor device from the circuit board at repair and reworking. In addition, since adhesion of all of the curable resin is fragmented by the two types of thermally expandable particles, almost no residue typically of resin of the adhesive remains on the circuit board after repair. Stress applied to the circuit board can also be minimized during repair.

Second Exemplary Embodiment

FIGS. 7A, 7B, 7C, and 8 illustrate semiconductor device mounting structure 30 in the second exemplary embodiment of the present invention, its manufacturing method, and a method of removing the semiconductor device.

Figure 7A:
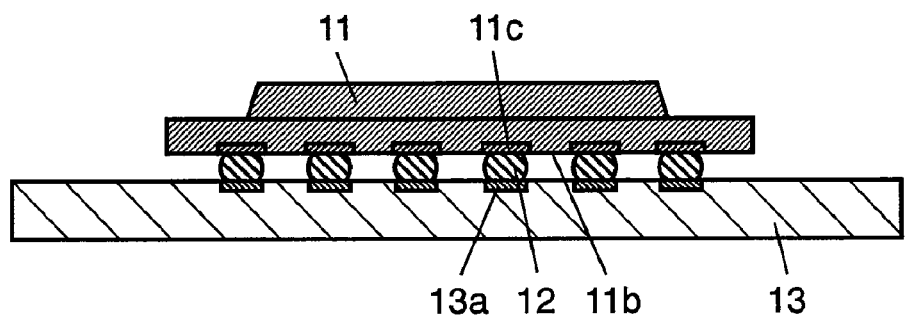
FIG. 7A is a schematic sectional view illustrating a semiconductor device mounting structure and its manufacturing method in accordance with a second exemplary embodiment of the present invention.
Figure 7B:
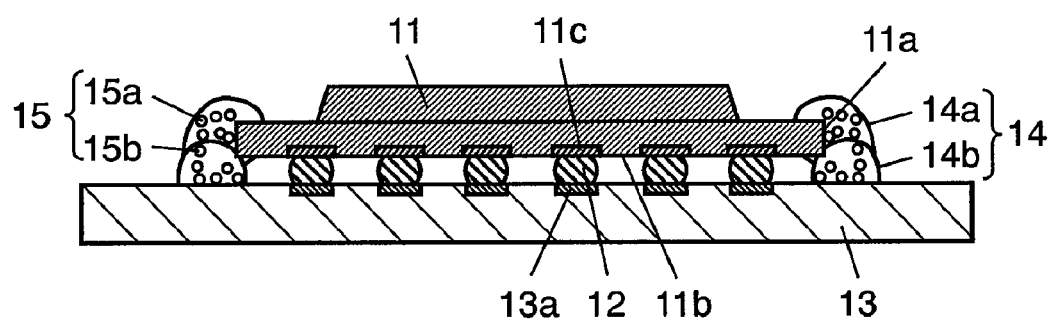
FIG. 7B is a schematic sectional view of the semiconductor device mounting structure and its manufacturing method in accordance with the second exemplary embodiment of the present invention. It shows the state that a second adhesive, in which at least second thermally expandable particles are mixed, is first applied to the circuit board, and then a first adhesive, in which first thermally expandable particles are mixed, is applied to the entire or a part of a top portion of the second adhesive. The second adhesive thermally expands at a second expansion temperature, and the first adhesive thermally expands at a first expansion temperature.
Figure 7C:
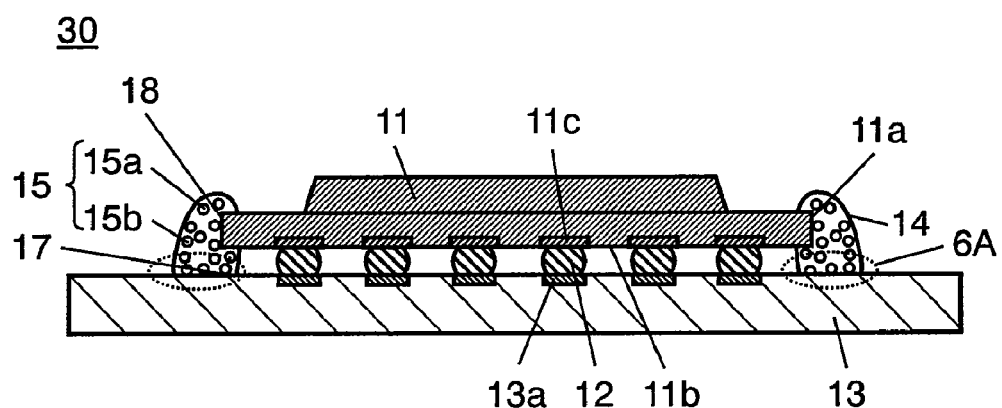
FIG. 7C is a schematic sectional view of the semiconductor device mounting structure and its manufacturing method in accordance with the second exemplary embodiment of the present invention. It shows the state that the first adhesive and the second adhesive are mixed at their boundary to form single curable resin.
Figure 8:
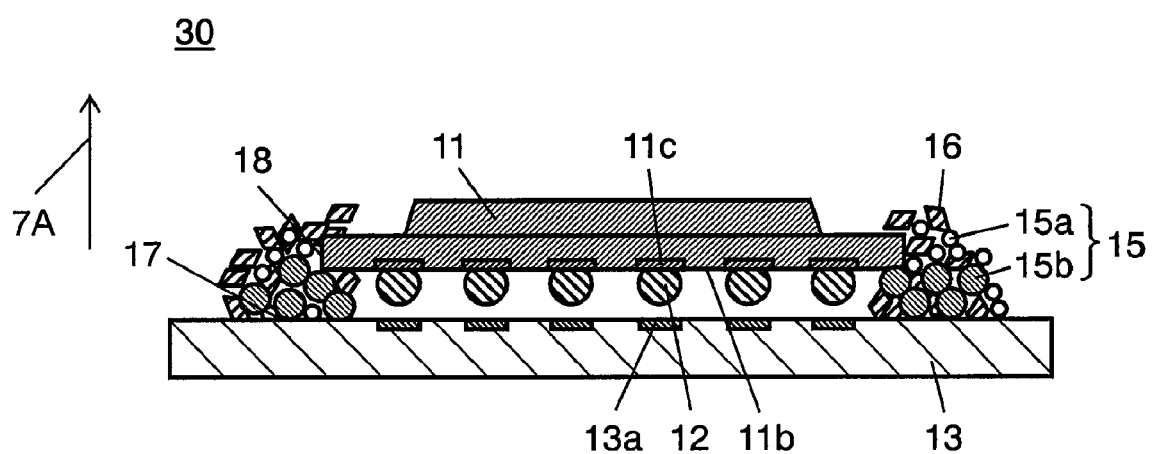
FIG. 8 is a schematic sectional view illustrating a removal method of the semiconductor device in accordance with the second exemplary embodiment of the present invention.

FIGS. 7A, 7B, and 7C are schematic sectional views of semiconductor device mounting structure 30 in this exemplary embodiment and its manufacturing method. Semiconductor device mounting structure 30 shown in FIG. 7C differs from semiconductor device mounting structure 10 in the first exemplary embodiment in the following way. The density of second thermally expandable particles 15b on boundary face 17 between curable resin 14, that is cured adhesive, and circuit board 13 is higher than the density of second thermally expandable particles 15b on boundary face 18 between curable resin 14 and side face 11a.

With this structure, semiconductor device mounting structure 30 demonstrates a high impact resistance to drop impact when semiconductor device 11 is mounted on circuit board 11. During repair and reworking, semiconductor device 11 can be easily removed from circuit board 13 because second thermally expandable particles 15b are contained in area 6A adjacent to boundary face 17 to circuit board 13 at a higher density. In addition, adhesion between curable resin 14 and circuit board 13 is sufficiently and immediately broken by second thermally expandable particles 15b. Accordingly, almost no residue typically of curable resin 14 remains on circuit board 13 after repair. Stress applied to circuit board 13 during repair can also be minimized.

A method of manufacturing semiconductor device mounting structure 30 in this exemplary embodiment includes soldering step S1, application step S2, and fixing step S3, basically applying the manufacturing method of semiconductor device mounting structure 10 in the first exemplary embodiment, shown in FIG. 3. The point that differs from the first exemplary embodiment is application step S2 after soldering step S1 in which semiconductor device 11 shown in FIG. 7A is electrically connected to circuit board 13 by solder bumps 12.

More specifically, in application step S2 shown in FIG. 7B, second adhesive 14b, in which at least second thermally expandable particles 15b that thermally expand at second expansion temperature T2 are mixed, is first applied to circuit board 13. Then, first adhesive 14a, in which at least first thermally expandable particles 15a that thermally expand at first expansion temperature T1 are mixed, is applied over the entire or a part of a top portion of second adhesive 14b. Solder bumps 12 is made of a material having melting point Tm higher than first expansion temperature T1 and lower than second expansion temperature T2. Solder bumps 12 used in this manufacturing method are made typically of a lead-free material of Sn.3.0% Ag.0.5% Cu that melts at 217° C. The two types of thermally expandable particles 15 (first thermally expandable particles 15a and second thermally expandable particles 15b) are typically thermally expandable microcapsules whose first expansion temperature T1 is 166° C. and second expansion temperature T2 is 220° C. In other words, the relationship of melting point Tm of solder bumps 12 with first expansion temperature T1 and second expansion temperature T2 is T1<Tm<T2.

Then, adhesive 14 applied in application step S2 is thermally cured to curable resin 14 to bond and fix semiconductor device 11 to circuit board 13 in fixing step S3. As a result, first adhesive 14a and second adhesive 14b in adhesive 14 are mixed at their boundary to form single curable resin 14 to complete semiconductor device mounting structure 30. Here, if particles with a small diameter are selected as first thermally expandable particles 15a so as to mix a larger amount of particles 15a in first adhesive 14a, a small portion of first thermally expandable particles 15a are also transferred to and contained in adhesive near circuit board 13.

Semiconductor device mounting structure 30 can be removed from semiconductor device 11 in the same way as that of the first exemplary embodiment shown in FIGS. 5A, 5B, 5C, and 6. More specifically, in semiconductor device mounting structure 30 shown in FIG. 8, curable resin 14 is heated to expand first thermally expandable particles 15a to make all of curable resin 14 brittle in advance. Then, this curable resin 14 is further heated to expand second thermally expandable particles 15b. This enables second thermally expandable particles 15b mixed at high density in an area adjacent to boundary face 17 of curable resin 14 to circuit board 13 greatly expands so as to mainly break curable resin 14 at boundary face 17 of curable resin 14 to circuit board 13. Semiconductor device 11 is thus lifted in a direction indicated by arrow 7A. Accordingly, semiconductor device 11 can be easily removed from circuit board 13.

The above structure and method offer the semiconductor device mounting structure that demonstrates high impact resistance after the semiconductor device is mounted on the circuit board, and easy removal of the semiconductor device from the circuit board at repair and reworking. In the repair and rework processes, the first thermally expandable particles with low expansion temperature is first expanded to make all of the curable resin brittle, and then the second thermally expandable particles with high expansion temperature is expanded to immediately break adhesion of all of the curable resin. Since the melting point of solder bump is set between the expansion temperatures of the above two types of thermally expandable particles, the semiconductor device can be easily removed from the circuit board in the semiconductor device mounting structure. In addition, the present invention is suited for mass production because the adhesive forming curable resin is applied only to the side face of the semiconductor device. In addition, almost no residue typically of curable resin remains on the circuit board after repair because all of the curable resin is fragmented by the two types of thermally expandable particles. Stress applied to the circuit board during repair can also be minimized.

What is claimed is:

1. A semiconductor device mounting structure comprising:
    a semiconductor device having an electrode aligned on its main face;
    a circuit board having a board electrode, the board electrode being electrically connected to the electrode of the semiconductor device by a solder bump; and
    curable resin in which different types of thermally expandable particles with different expansion temperatures are mixed, the curable resin being applied between at least a side face of the semiconductor device and the circuit board while providing an empty area between the semiconductor device and the circuit board.

2. The semiconductor device mounting structure of claim 1, wherein the curable resin is applied between at least an entire periphery of the side face of the semiconductor device and the circuit board.

3. The semiconductor device mounting structure of claim 1, wherein the curable resin is applied between at least only a plurality of discontinuing points on the entire periphery of the side face of the semiconductor device and the circuit board.

4. The semiconductor device mounting structure of claim 1, wherein the different types of thermally expandable particles include at least two types that are: first thermally expandable particles that thermally expand at a first expansion temperature, and second thermally expandable particles that thermally expand at a second expansion temperature; and
    a melting point of the solder bump is higher than the first expansion temperature and lower than the second expansion temperature.

5. The semiconductor device mounting structure of claim 4, wherein a density of the second thermally expandable particles on a boundary face between the curable resin and the circuit board is higher than a density of the second thermally expandable particles on a boundary face between the curable resin and the side face.

6. The semiconductor device mounting structure of claim 4, wherein the first expansion temperature is not less than 120° C. and not more than 200° C., and the second expansion temperature is not less than 220° C. and not more than 240° C.

7. The semiconductor device mounting structure of claim 5, wherein the first expansion temperature is not less than 120° C. and not more than 200° C., and the second expansion temperature is not less than 220° C. and not more than 240° C.

* * * * *